FREQUENCY CONTROL SYSTEM

Filed Dec. 2, 1954 2 Sheets-Sheet 1

INVENTOR.
Arthur C. Stocker
BY
J. A. Rechif
AGENT

July 15, 1958 A. C. STOCKER 2,843,739

FREQUENCY CONTROL SYSTEM

Filed Dec. 2, 1954 2 Sheets-Sheet 2

INVENTOR.
Arthur C. Stocker
BY
J. A. Rechif
AGENT

United States Patent Office 2,843,739

Patented July 15, 1958

2,843,739

FREQUENCY CONTROL SYSTEM

Arthur C. Stocker, Collingswood, N. J., assignor to Radio Corporation of America, a corporation of Delaware Application December 2, 1954, Serial No. 472,585

10 Claims. (Cl. 250—36)

This invention relates to a frequency control system for an oscillator, and more particularly to a system for adjusting an oscillator to, and thereafter stabilizing the oscillator at, a particular selected frequency.

In prior oscillator frequency control and stabilization systems, the phases of two radio frequency waves are compared, the phase difference is converted to a unidirectional voltage, this voltage is filtered to remove any radio frequency (R. F.) signal components therefrom, and the filtered voltage is then applied to a reactance tube which controls the oscillator. In such systems, some time is required for the signal to pass through the filter; hence, any sudden momentary excursion in oscillator frequency is allowed to go uncorrected. In other words, such systems are ineffective to suppress any high frequency FM noise, that is, undesired FM, that may occur in the oscillator, and some of this usually does occur. Furthermore, this time delay due to the filter contributes to limiting the frequency range over which the oscillator frequency can be controlled.

Accordingly, an object of this invention is to devise a novel type of frequency control system in which the time delay in the frequency control feedback loop is effectively eliminated, thus extending the control range and rendering the feedback loop effective against wide band FM noise occurring in the oscillator.

Another object is to simplify a frequency control system, so as to eliminate the need for a phase detector, a filter, or a reactance tube, since all of these components are relatively difficult to design and adjust.

The objects of this invention are accomplished, briefly, in the following manner: In a first mixer, the output of the master or captive oscillator to be controlled is mixed with a selected standard or reference harmonic frequency derived from a harmonic generator, the selection of the particular harmonic frequency being effected by means of a tunable R. F. amplifier. One beat frequency is selected from the output of the first mixer and applied to a second mixer, along with the output of a vernier or interpolation oscillator which is tunable over a certain small range. One beat frequency is selected from the output of the second mixer and applied to a third mixer, along with a harmonic frequency derived from the harmonic generator. One beat frequency is selected from the output of the third mixer and is applied, either directly or after another mixing step, as an R. F. injection signal to control (lock in) the frequency of the master oscillator by means of a frequency control tube which operates merely as an R. F. amplifier. In every case, the beat frequencies are selected from the respective mixer outputs by means of tunable R. F. amplifiers. The tunable R. F. amplifiers, the vernier oscillator and the master oscillator are gang-tuned by means of two drive knobs associated with respective counter dials, the readings of which together indicate the output frequency of the master oscillator. For frequency shift telegraphy, the frequency of the vernier oscillator may be shifted (keyed) by means of a reactance tube, in order to shift the frequency of the master (captive) oscillator.

The foregoing and other objects of the invention will be better understood from the following description of some exemplifications thereof, reference being had to the accompanying drawings, wherein.

Figures 1, 2:
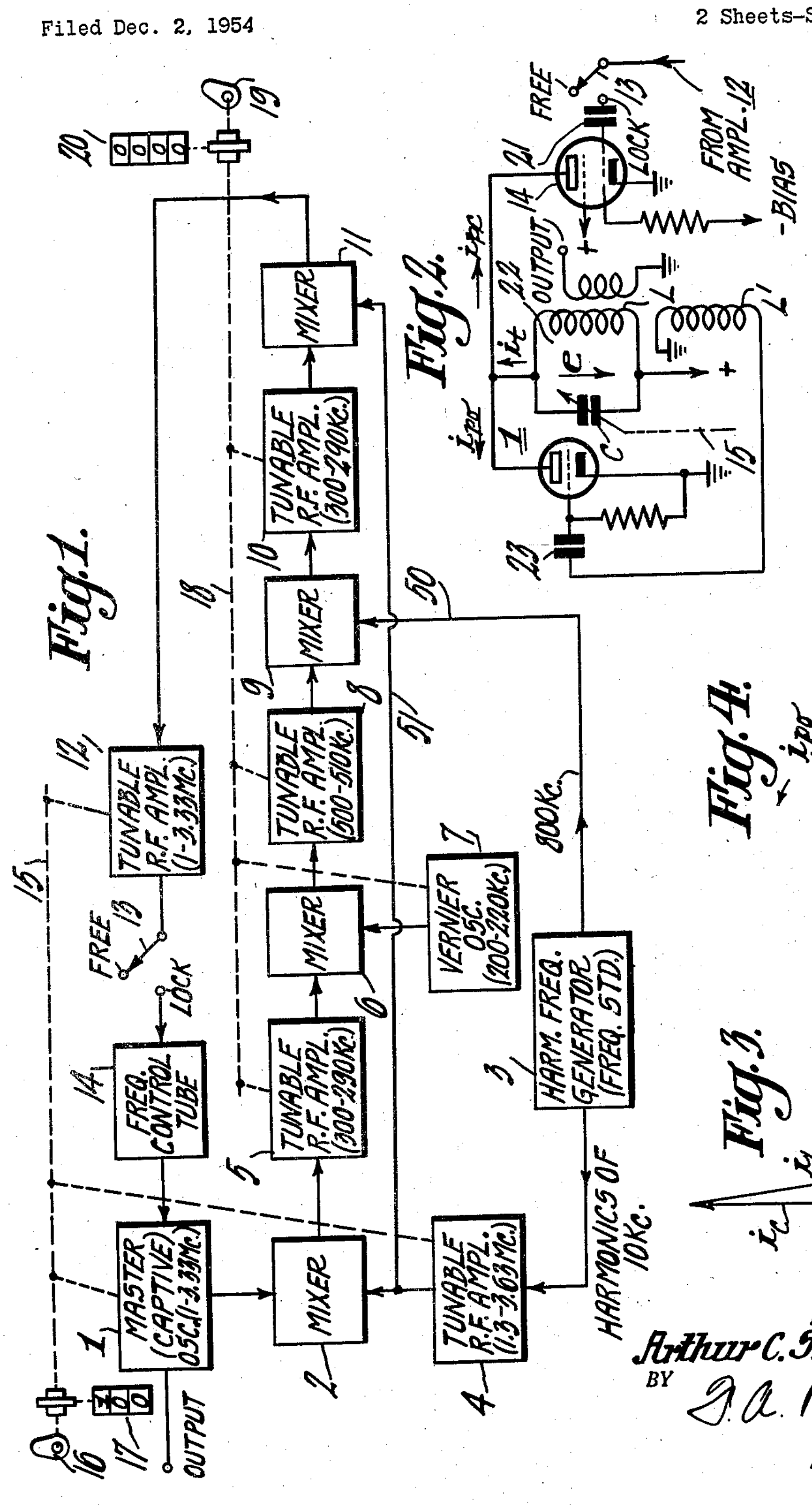
Fig. 1 is a block diagram of one embodiment of a system according to this invention.
Fig. 2 is a detailed circuit diagram of a portion of Fig. 1.

Referring now to Fig. 1, which is a block diagram of one system according to this invention, a master or captive oscillator 1 is the oscillator that is to be controlled or stabilized according to this invention. The stabilized output of oscillator 1 (taken from the terminal labelled "output") may be used in a frequency meter, whereby the oscillator in a transmitter or receiver may be set to its assigned frequency. Alternatively, oscillator 1 may be itself used as the exciter oscillator in a transmitter or as the heterodyne oscillator in a receiver, or for both a transmitter and a receiver. For such uses, it is necessary that there be an accurately fixed relation between the setting of the oscillator dials and the value of the oscillator frequency. Furthermore, it would be convenient if the dials could indicate the oscillator output frequency directly. In the systems of this invention, both of these desirable results are brought about. The systems of frequency control of this invention operate entirely at radio frequency, and do not use direct current (D. C.) operating on a reactance tube for oscillator frequency control purposes.

In Fig. 1, the output of the oscillator 1 (which may be tunable over a range of 1 to 3.33 mc., as indicated) is sampled and applied to a mixer 2, along with a signal some 300 kc. higher in frequency. This latter signal is derived from a harmonic frequency generator 3 which serves as a frequency standard and which produces, in its output, harmonics of 10 kc., that is, adjacent harmonics spaced 10 kc. apart, by way of a tunable R. F. amplifier 4, which is tunable over a range of 1.3 to 3.63 mc. Generator 3 may for example be an oscillator which is stabilized in any suitable way, such as by means of a piezoelectric crystal. Amplifier 4 selects and amplifies any particular 10-kc. harmonic out of generator 3, according to the tuning of said amplifier. As will be described further hereinafter, amplifier 4 and master oscillator 1 are arranged to be gang-tuned mechanically.

Wave energies from oscillator 1 and from amplifier 4 (derived from generator 3) beat together in mixer 2 to provide a beat frequency signal in the frequency band of 290–300 kc., this beat frequency being the difference of the frequencies from oscillator 1 and amplifier 4. Assuming for purposes of example that the oscillator 1 is controlled at a frequency of 1 mc., amplifier 4 would select and amplify a wave of 1300-kc. frequency derived from generator 3, giving a beat frequency of 300 kc. of mixer 2. A tunable R. F. amplifier 5, coupled to the output of mixer 2, selects and amplifies the beat frequency signal in the band of 290–300 kc. and passes the same on as one input to a mixer 6. A vernier oscillator 7, tunable over a frequency band from 200 to 220 kc., for example, provides the other input to mixer 6. In the example, the output of amplifier 5 would be at 300 kc.

Wave energies from amplifier 5 and oscillator 7 beat together in mixer 6 to provide a beat frequency signal in the frequency band of 500–510 kc., this beat frequency being the sum of the frequencies from oscillator 7 and amplifier 5. In the example, oscillator 7 would be operating at 200 kc., giving a sum frequency of 500 kc. out of mixer 6. A tunable R. F. amplifier 8, coupled to the output of mixer 6, selects and amplifies the beat frequency signal in the band of 500–510 kc. and passes the same on as one input to a mixer 9. An 800-kc. wave derived from generator 3 over lead 50 provides the other input to mixer 9. In the example, the output of amplifier 8 would be at 500 kc.

Wave energies from amplifier 8 and generator 3 (the latter being at 800 kc.) beat together in mixer 9 to provide a beat frequency signal in the frequency band of 290–300 kc., this beat frequency being the difference of the frequencies from amplifier 8 and generator 3. In the example, this difference frequency out of mixer 9 would be 300 kc. A tunable R. F. amplifier 10, coupled to the output of mixer 9, selects and amplifies the beat frequency signal in the band of 290–300 kc. and passes the same on as one input to a mixer 11. In the example, the output of amplifier 10 would be at 300 kc. The output of amplifier 4, which in the example is at 1300 kc., provides the other input to mixer 11 over lead 51.

Wave energies from amplifiers 10 and 4 beat together in mixer 11 to provide a beat frequency signal in the frequency band of 1–3.33 mc., this beat frequency being the difference of the frequencies from amplifiers 10 and 4. In the example, this difference frequency out of mixer 11 would be 1000 kc. or 1 mc. A tunable R. F. amplifier 12, coupled to the output of mixer 11, selects and amplifies the beat frequency signal in the band of 1–3.33 mc. and impresses the same, via a switch 13 (when this switch is in the "lock" or closed position), on a frequency control tube 14 which is coupled to the master oscillator 1. In the example, the output of amplifier 12 would be at 1 mc. The R. F. output of amplifier 12 is in effect injected (by means of control tube 14) into the oscillator 1, to lock in the frequency of the latter at 1 mc. The mode of operation of this control by R. F. injection will be explained in more detail hereinafter.

The oscillator 1, the amplifier 4 and the amplifier 12, as well as the other amplifiers, oscillators and mixers, are electron discharge devices and are arranged to be unicontrolled, that is, arranged for gang-tuning, as indicated by the dotted-line connection 15. A drive knob 16 is provided for rotating the shaft 15, to thereby tune units 1, 4 and 12. A counter dial 17 is mounted to be driven by shaft 15, this dial having spaces for indicating three digits which are the first three digits of the master oscillator frequency, in cycles per second (C. P. S.). It will be noted that the units 1, 4 and 12 are all tunable over a frequency range of 2.33 mc.

The amplifier 5, the vernier oscillator 7, the amplifier 8 and the amplifier 10 are arranged to be unicontrolled, that is, arranged for gang-tuning, as indicated by the dotted-line connection 18. A drive knob 19 is provided for rotating the shaft 18, to thereby tune units 5, 7, 8 and 10. A counter dial 20 is mounted to be driven by shaft 18, this dial having spaces for indicating four digits which are the last four digits of the master oscillator frequency, in C. P. S. It will be noted that the amplifiers 5, 8 and 10 are all tunable over a frequency range of 10 kc., while the oscillator 7 is tunable over a range of 20 kc.

The amplifiers 5, 8, 10 and 12 operate with high input signals and need have only little more than enough gain to overcome their own losses; their main purpose is to provide selectivity.

The R. F. injection control of oscillator 1 by way of frequency control tube 14 will now be explained with reference to Fig. 2, which is a circuit diagram of a typical oscillator and frequency control tube circuit. It may be seen that the R. F. output of amplifier 12 is applied to the control grid of tube 14 by way of a capacitor 21, when switch 13 is in its closed or "lock" position. The anode of tube 14 is coupled directly to the anode of oscillator tube 1. The control tube 14 merely amplifies the R. F. energy supplied thereto and adds a component of R. F. current to the current normally flowing in the oscillator tank circuit 22. The oscillator 1, as illustrated in Fig. 2, may be a tuned-anode feedback oscillator, feedback being effected from the tuned anode circuit 22 to the grid of the oscillator tube by way of the coil L′ and a capacitor 23.

Figure 3:
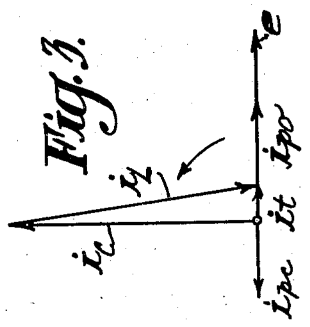
Figs. 3 and 4 are vector diagrams useful in explaining the operation of Fig. 2.

When the circuit 22 is oscillating at the frequency of the signal injected from tube 14, the vector diagram of Fig. 3 applies. The current $i_C$ in the capacitor C of the oscillator tank circuit 22 leads the voltage $e$ by 90°, and the current $i_L$ in the inductor L of the tank circuit lags the voltage $e$ by something less than 90°, the vectorial difference between $i_C$ and $i_L$ being the tank current $i_t$ which supplies the power to overcome the losses in the circuit 22 and its load. The current $i_t$ in a simple oscillator is supplied by the oscillator tube. However, in an oscillator such as that used in this invention, where frequency control is effected by injection, the injection current $i_{pc}$ is at such a phase that it opposes the oscillator plate current; so, to keep the tank current the same as before, the oscillator tube must supply an increased current, shown as $i_{po}$. Under these conditions the oscillator frequency will be constant and will be locked-in to the frequency (in the R. F. range) supplied from amplifier 12 to tube 14.

If the master oscillator 1 is locked in at 1500 kc., the frequencies at which the various units around the loop in Fig. 1 are operating would be as follows: amplifier 4, 1800 kc.; amplifier 5, 300 kc.; oscillator 7, 200 kc.; amplifier 8, 500 kc.; amplifier 10, 300 kc.; amplifier 12, 1500 kc.

The function of amplifier 12 is to pass the frequency at which the oscillator 1 is operating and to stop the frequencies applied to the preceding mixer 11. In the example given in the preceding paragraph, amplifier 12 would be tuned to pass 1500 kc. but stop 1800 kc. and 300 kc.

Now, for example, consider what occurs when the frequency of the vernier oscillator 7 is raised from 200 kc. to 202 kc., without making any other change. The frequencies around the loop would then be momentarily, but only momentarily, as follows: amplifier 4, 1800 kc.; amplifier 5, 300 kc.; oscillator 7, 202 kc.; amplifier 8, 502 kc.; amplifier 10, 298 kc.; amplifier 12, 1502 kc.

In this case, the injection frequency out of amplifier 12 (1502 kc.) is momentarily higher than the oscillator frequency (1500 kc.). In the first small interval of time, the injection current $i_{pc}$ (Fig. 2) will swing ahead in phase from its normal condition of phase opposition to $i_{po}$, giving the partial vector diagram of Fig. 4. Using the values given in the preceding paragraph, the 30° angle between the direction of $i_{pc}$ and its normal direction would be reached in 0.05 millisecond. One component of the current $i_{pc}$ still opposes the plate current $i_{po}$ of the oscillator, but there is now another component marked "corrective current." This latter component is reactive and has the same phase as the current $i_L$ through the inductor L (see Fig. 3). That is, it is the same as the current that would flow through another inductor connected in parallel with inductor L of Fig. 2; as is well known, the result is an increase in the frequency of the oscillator 1. The increase is effective to raise the frequency of oscillator 1 to a value which maintains the phase of the injection current $i_{pc}$ at such an angle as will maintain that frequency increase, and under these conditions the oscillator frequency will again be constant at a new (higher) frequency. With the first incremental change in master oscillator frequency, the signal in amplifier 5 lags, and that in the amplifier 8 lags (it will be remembered that the signal in this latter amplifier leads when the frequency of the vernier oscillator 7 is first raised), thereby limiting the change in master oscillator frequency.

Continuing with the example, frequency control can be established (giving stability at a new master oscillator frequency) only when the master oscillator operates at 1501 kc. (a frequency higher than its original frequency), when the frequencies around the loop would be: amplifier 4, 1800 kc.; amplifier 5, 299 kc.; oscillator 7, 202 kc.; amplifier 8, 501 kc.; amplifier 10, 299 kc.; amplifier 12 (switch 13), 1501 kc. Thus, frequency control (adjustment of the oscillator 1 to a new frequency) is effected, and in a very short time.

The reverse action takes place if the frequency of vernier oscillator 7 is now lowered from its new value of 202 kc., to adjust the oscillator 1 back to a lower frequency, such as 1500 kc. Then, the injection current $i_{pc}$ will lag behind its normal condition of phase opposition to $i_{po}$ and the corrective current will add to $i_C$, which is equivalent to connecting a capacitor in parallel with capacitor C of Fig. 2, decreasing the frequency of oscillator 1. The decrease is effective to lower the frequency of oscillator 1 to a value which maintains the phase of the injection current $i_{pc}$ at such an angle as will cause that frequency decrease, and the oscillator frequency is stabilized at the new (lower) frequency, such as 1500 kc.

In the use of the master oscillator of this invention as a frequency meter whereby the oscillator in a transmitter or receiver may be set to its assigned frequency, or itself as the oscillator in a transmitter or receiver, it is necessary that there be an accurately fixed relation between the setting of the oscillator dials 17, 20 and the value of the master oscillator frequency; also, it would be convenient if these dials could indicate the master oscillator frequency directly. According to this invention, high accuracy is obtained by locking the master oscillator 1 to a crystal standard 3, while the exact frequency desired is obtained by offsetting from the standard by means of a vernier oscillator 7. Direct reading dials are obtained by calibrating the master oscillator dial 17 in frequency and the vernier oscillator dial 20 in frequency change. To set up the frequency 1,527,030 C. P. S. on oscillator 1, the switch 13 is set to the "free" or open position and the vernier oscillator 7 is set to 200 kc., at which frequency its dial 20 reads 0000. The master oscillator 1 is then adjusted by means of knob 16 until its dial 17 reads 152, when its frequency is near 1520 kc. Then, the switch 13 is set to the "lock" or closed position, which locks the master oscillator 1 to the 1820-kc. signal coming from the frequency standard 3 via block 4. When locked, the frequency of oscillator 1 becomes 1,520,000 C. P. S. Then, the frequency of the vernier oscillator 7 is adjusted by means of knob 19 until its dial 20 reads 7030, thereby raising the frequency of the master oscillator 7030 C. P. S., to the desired frequency. Thus, the knob 16 controls the approximate frequency of the master oscillator 1 and selects the proper frequencies (in units 4 and 12) for its control, the knob 19 controls the frequency of the vernier oscillator 7 and tunes associated circuits 5, 8 and 10 to the frequencies they are required to pass, and the two dials 17 and 20 together indicate the value of the master oscillator output frequency.

The frequency control system of this invention also operates to correct frequency errors of the master oscillator 1 that tend to occur even when the said oscillator has been adjusted to the desired, chosen frequency. In other words, the oscillator 1, besides being a captive oscillator, is a stabilized oscillator. This mode of operation will now be explained. If the frequency of the oscillator 1 tends to drift, for example toward a higher frequency, the phase of the signal in amplifier 5 will lag, due to the fact that this amplifier selects the difference of the frequences of 1 and 4. The phase of the signal in amplifier 8 will also lag, due to the selection of a sum frequency in this amplifier; that in the amplifier 10 will lead, due to the selection of a difference frequency in this amplifier; and that in the amplifier 12 (at switch 13) will lag, due to the selection of a difference frequency in this amplifier. The plate current $i_{pc}$ of the frequency control tube 14 will lag behind its normal condition of phase opposition to $i_{po}$, displaying a component of reactive current which has the same phase as the current $i_C$ through the capacitor C (see Fig. 3). This component of reactive current is the equivalent of connecting a capacitor in parallel with capacitor C of Fig. 2, and tends to decrease the frequency of oscillator 1, thereby counteracting the original tendency toward increase of the oscillator frequency.

Figure 4:
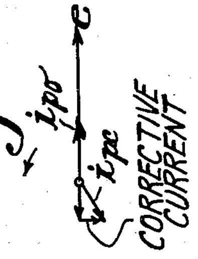

The reverse action takes place if the frequency of oscillator 1 tends to decrease, that is, a component of reactive current is then produced at $i_{pc}$ which tends to increase the frequency of oscillator 1, the phase relations then being as indicated in the partial vector diagram of Fig. 4.

Figures 5, 6, 7:
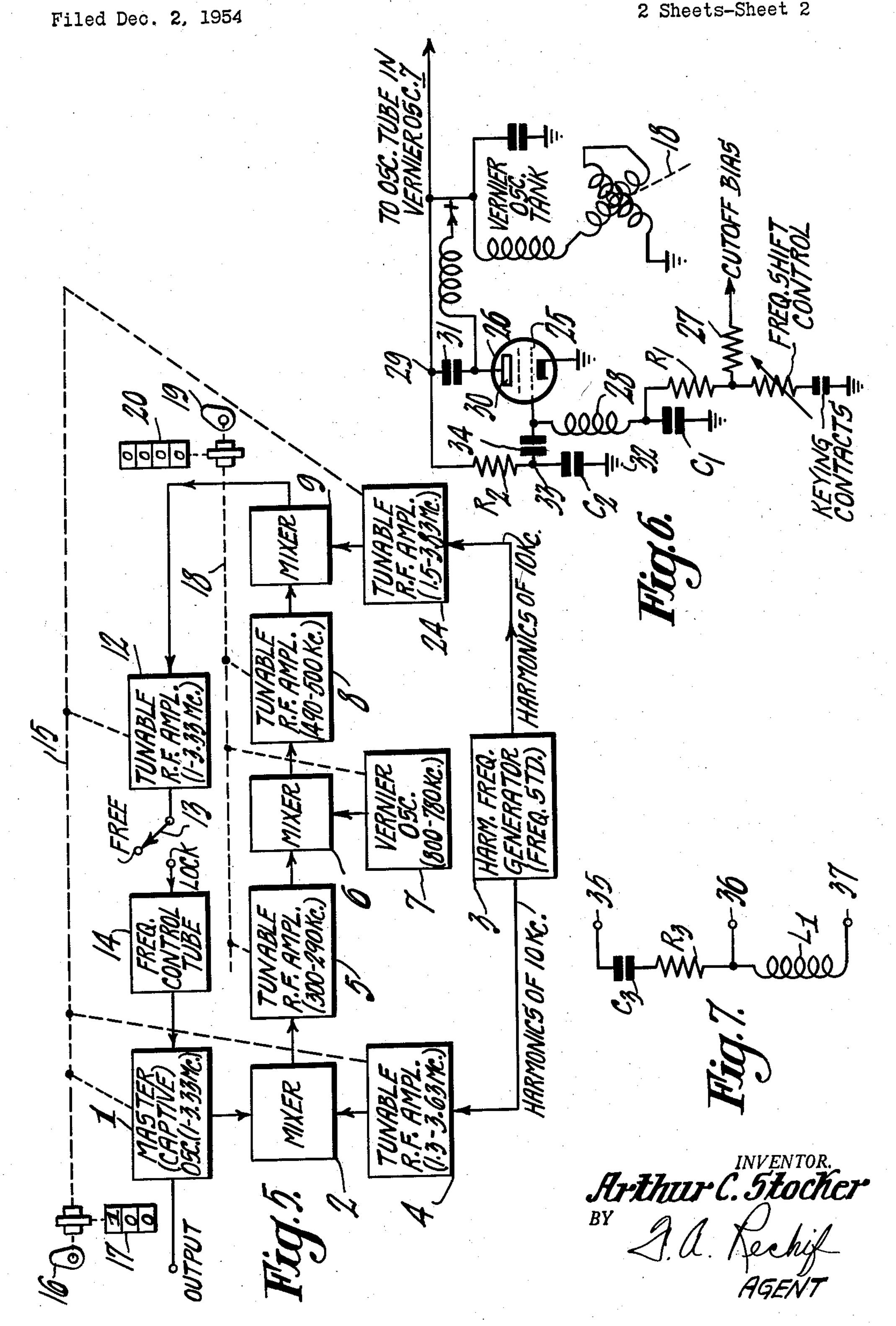
Fig. 5 is a block diagram of another embodiment of the invention.
Fig. 6 is a circuit diagram of an arrangement for effecting frequency shift keying.
Fig. 7 is a circuit diagram for a modification of a portion of Fig. 6.

Fig. 5 discloses another embodiment of the invention, that is, another system for frequency control by means of R. F. feedback. The Fig. 5 system differs from that of Fig. 1 in that one mixer and the following tunable amplifier have been omitted, at the expense of adding another tunable R. F. amplifier for the selection of a different harmonic of the 10-kc. standard frequency signal.

In Fig. 5, the signal from the master (captive) oscillator 1 is combined in the mixer 2 with a signal from the frequency standard 3 some 300 kc. higher, as selected and amplified by the tunable R. F. amplifier 4. Any beat frequencies in the band of 290–300 kc. in the output of mixer 2 are selected by the tunable R. F. amplifier 5 and combined in the mixer 6 with a signal in the frequency band of 780–800 kc. from the vernier oscillator 7. Any beat frequencies in the band of 490–500 kc. in the output of mixer 6 are selected by the tunable R. F. amplifier 8 and combined in the mixer 9 with a signal from the frequency standard 3 some 1 mc. higher, as selected by the tunable R. F. amplifier 24 the input of which is coupled to the output of generator or frequency standard 3. Any beat frequencies in the band of 1–3.33 mc. in the output of mixer 9 are selected by the tunable R. F. amplifier 12 and applied via the switch 13 (when in its "lock" or closed position) to the frequency control tube 14, thereby effecting control of oscillator 1.

Items 1, 4, 12 and 24 are arranged to be unicontrolled or gang-tuned by shaft 15, drive knob 16 and counter dial 17 being coupled to this shaft. It is noted that these units are each tunable over a frequency range of 2.33 mc. Items 5, 7 and 8 are arranged to be unicontrolled or gang-tuned by shaft 18, drive knob 19 and counter dial 20 being coupled to this shaft. Units 5 and 8 are each tunable over a frequency range of 10 kc., while oscillator 7 is tunable over a frequency range of 20 kc.

Assuming frequency control has been effected, so that the master oscillator 1 is controlled at 1 mc. (1000 kc.), the frequencies around the system are: amplifier 4, 1300 kc.; amplifier 5, the difference between the frequencies of 1 and 4, 300 kc.; vernier oscillator 7, 800 kc.; amplifier 8, the difference between the frequencies of 5 and 7, 500 kc.; amplifier 24, 1500 kc.; amplifier 12, the difference between the frequencies of 8 and 24, 1000 kc. or 1 mc.

If the frequency of the oscillator 1 tends to drift, for example toward a higher frequency, in the system of Fig. 5 an R. F. feedback voltage will be developed which will counteract this tendency. This comes about by reason of the following. As the phase angle of the master oscillator 1 goes ahead (or leads), the phase of the signal in amplifier 5 lags, because the difference between the frequencies of 1 and 4 is selected by amplifier 5, The phase of the signal in amplifier 8 leads, because the difference between the frequencies 5 and 7 is selected in this amplifier; the phase of the signal in amplifier 12 (at the switch 13, and applied to tube 14 when this switch is closed) lags, because the difference between the frequencies of 8 and 24 is selected in amplifier 12. As previously explained, this means that the plate current $i_{pc}$ of the frequency control tube 14 will lag behind its normal condition of phase opposition to $i_{po}$, which is equivalent to connecting a capacitor in parallel with capacitor C of Fig. 2. This tends to decrease or lower the frequency of oscillator 1, thereby counteracting the original tendency toward increase of the oscillator frequency.

The reverse action takes place if the frequency of oscillator 1 tends to decrease, that is, a component of reactive current is then produced at $i_{pc}$ which tends to increase the frequency of oscillator 1, the phase relations then being as indicated in the partial vector diagram of Fig. 4.

To illustrate the action of the vernier oscillator 7 of Fig. 5 in adjusting the frequency of master oscillator 1, it will be assumed that (1) the natural frequency of oscillator 1 is exactly 1 mc., so that no correction is necessary, and (2) the frequency of the vernier oscillator 7 is lowered. With the first incremental change in vernier oscillator frequency, the phase of the signal in amplifier 8 lags; that in the amplifier 12 (at switch 13 and tube 14) will then lead, creating the situation illustrated in the partial vector diagram of Fig. 4 and causing the frequency of the master oscillator 1 to increase. With the first incremental change in master oscillator frequency, the phase of the signal in amplifier 5 lags and that in the amplifier 8 leads, thereby limiting the change in the frequency of the master oscillator (it will be recalled that the phase of the signal in amplifier 8 lags with the first incremental change in vernier oscillator frequency).

If the frequency of the vernier oscillator 7 is lowered 4 kc., frequency control can be established (giving stability at a new master oscillator frequency) only when the master oscillator operates at 1002 kc. (a frequency higher than its original frequency), when the frequencies around the loop would be: amplifier 4, 1300 kc.; amplifier 5, 298 kc.; vernier oscillator 7, 796 kc.; amplifier 8, 498 kc.; amplifier 24, 1500 kc.; amplifier 12 (switch 13), 1002 kc. Thus, frequency control (adjustment of the oscillator 1 to a new frequency) is effected, in a very short time.

The reverse action takes place if the frequency of vernier oscillator 7 is now raised, for example by 4 kc., to adjust the oscillator 1 to a lower frequency, such as 1000 kc. Then, the plate current $i_{pc}$ will lag behind its normal condition of phase opposition to $i_{po}$, which is equivalent to connecting a capacitor in parallel with capacitor C of Fig. 2, decreasing the frequency of oscillator 1. The decrease is effective to lower the frequency of oscillator 1 to a value which maintains the phase of the injection current $i_{pc}$ at such an angle as will cause that frequency decrease, and the oscillator frequency is stabilized at a new (lower) frequency.

It will be noted that in the Fig. 1 system a lowering of the vernier oscillator frequency results in a decrease of the master oscillator frequency, while in the Fig. 5 system a lowering of the vernier oscillator frequency results in an increase of the master oscillator frequency. Thus, opposite effects are produced in these two systems, and the vernier oscillator dials 20 must be calibrated differently in the two systems, if the dials are to indicate the master oscillator frequency directly.

The master oscillator 1 may be used as the master oscillator of a radio transmitter, as previously stated. In radio-telegraphy, with the tendency toward frequency shift keying the advantages of increased transmitter stability become even more important than before. In the frequency control systems of Figs. 1 and 5, frequency shift keying may be had by introducing a shift in the frequency of vernier oscillator 7. Since both of these systems involve a closed loop and since a small but definite time is required for the signal to traverse this loop, any attempt to shift frequency instantaneously (as by the opening and closing of a contact) is apt to lead to undesirable transient conditions. It is desirable, therefore, to introduce a slight delay, say .001 sec., in the keying system.

In Fig. 6 there is disclosed a circuit for frequency shift keying of the vernier oscillator 7, by means of a reactance tube of more or less conventional arrangement. In Fig. 6, when the "keying contacts" are open during one of the operating conditions (either mark or space), cutoff bias is applied from a source labelled "cutoff bias" to the control grid 25 of a reactance tube 26, by way of resistors 27 and $R_1$ and an inductor 28. This cutoff bias is applied in order to remove error due to variations in the mutual conductance of tube 26, thereby assuring that the dials 17 and 20 (Figs. 1 and 5) will read the actual frequency for this operating condition.

Upon application of the other condition (space or mark) by closure of the "keying contacts," the bias on the reactance tube control grid 25 is lowered at a rate determined by resistor $R_1$ and capacitor $C_1$ (which latter is connected from the junction of inductor 28 and resistor $R_1$ to ground), to a value determined by the "frequency shift control" variable resistor, since the closure of the "keying contacts" completes a circuit from the common junction of resistors $R_1$ and 27 through the "frequency shift control" resistor to ground. The bias on the reactance tube control grid being lowered, the resultant reactive plate current in reactance tube 26 introduces a frequency shift in the vernier oscillator 7. This in turn shifts the frequency of the master oscillator 1 (and hence of the transmitted signal) by reason of the modus operandi previously set forth herein.

Point 29 is coupled to the reactance tube anode 30 by way of a capacitor 31. In Fig. 6, between point 29 and ground 32 there is connected a network consisting of a resistor $R_2$ and a capacitor $C_2$ in series in that order, the common junction 33 between $R_2$ and $C_2$ being coupled to grid 25 through a capacitor 34. The shift in the frequency of vernier oscillator 7 when the "keying contacts" are closed may be made upward by connecting the phasing network $R_2$, $C_2$ as described.

The shift in the frequency of vernier oscillator 7 when the "keying contacts" are closed may be made downward by the use of the phasing network shown in Fig. 7 in place of the network $R_2$, $C_2$ of Fig. 6. To effect this, $R_2$ and $C_2$ would be removed from Fig. 6 and terminal 35 of Fig. 7 would be connected to point 29, terminal 36 of Fig. 7 would be connected to point 33, and terminal 37 of Fig. 7 would be connected to ground 32. In Fig. 7, capacitor $C_3$ effects a phase angle correction to compensate for the inherent resistance of inductor $L_1$. In the Fig. 7 network, capacitor $C_3$ and resistor $R_3$ are connected in series between the terminals 35 and 36, and inductor $L_1$ is connected between the terminals 36 and 37.

It may be seen that in the frequency control system of this invention no phase detector, filter, or reactance tube are used, thus eliminating the drawbacks ordinarily arising in connection with the use of these items.

What is claimed is:

1. A frequency generation system comprising a captive oscillator whose frequency is to be controlled, means for utilizing solely the output of said oscillator as the output of the system, means for mixing a portion of the output of said oscillator with solely a stabilized standard frequency wave to produce a first beat frequency wave in the radio frequency range, an oscillator, means for mixing the output of said last-mentioned oscillator with said beat frequency wave to produce a second beat frequency wave in the radio frequency range, and means for applying a radio frequency wave representative of said second beat frequency wave to said captive oscillator to lock in its frequency with said representative wave.

2. A frequency generator system comprising a captive oscillator whose frequency is to be controlled, means for utilizing solely the output of said oscillator as the output of the system, means for mechanically varying the tuning of said oscillator over a predetermined frequency range, means for mixing a portion of the output of said oscillator with solely a stabilized standard frequency wave to produce a first beat frequency wave in the radio frequency range, an oscillator, means for mechanically varying the tuning of said last-mentioned oscillator over a predetermined frequency range, means for mixing the output of said last-mentioned oscillator with said beat frequency wave to produce a second beat frequency wave in the radio frequency range, and means for applying a radio frequency wave representative of said second beat frequency wave to said captive oscillator to lock in its frequency with said representative wave.

3. In combination, a captive oscillator whose frequency is to be controlled, said oscillator being mechanically tunable over a predetermined frequency range, a source of harmonic frequency waves, first tunable means coupled to the output of said source for selecting from such output a particular harmonic, means for mixing a portion of the output of said oscillator with the output of said first tunable means to produce a first beat frequency wave in the radio frequency range, an oscillator, means for mixing the output of said last-mentioned oscillator with said beat frequency wave to produce a second beat frequency wave in the radio frequency range, means for heterodyning a wave representative of said second wave to a different frequency, second tunable means coupled to the output of said heterodyning means for selecting from such output a particular wave in the radio frequency range, unicontrol means for tuning said captive oscillator and said first and second tunable means, and means for applying the particular radio frequency wave selected by said second tunable means to said captive oscillator to lock in its frequency with said particular radio frequency wave.

4. In combination, a captive oscillator whose frequency is to be controlled, means for mixing a portion of the output of said oscillator with a stabilized wave, tunable means coupled to the output of said mixing means for selecting from such output a particular first beat frequency wave in the radio frequency range, an oscillator mechanically tunable over a predetermined frequency range, unicontrol means for tuning said tunable means and said last-mentioned oscillator, means for mixing the output of said last-mentioned oscillator with the output of said tunable means to produce a second beat frequency wave in the radio frequency range, and means for applying a radio frequency wave representative of said second beat frequency wave to said captive oscillator to lock in its frequency with said representative wave.

5. In combination, a captive oscillator whose frequency is to be controlled, means for mixing a portion of the output of said oscillator with a stabilized wave, first tunable means coupled to the output of said mixing means for selecting from such output a particular first beat frequency wave in the radio frequency range, an oscillator mechanically tunable over a predetermined frequency range, means for mixing the output of said last-mentioned oscillator with the output of said first tunable means, second tunable means coupled to the output of said last-named mixing means for selecting from such output a particular second beat frequency wave in the radio frequency range, unicontrol means for tuning said first and second tunable means and said last-mentioned oscillator, and means for applying a radio frequency wave representative of said second beat frequency wave to said captive oscillator to lock in its frequency with said representative wave.

6. In combination, a captive oscillator whose frequency is to be controlled, means for mechanically varying the tuning of said oscillator over a predetermined frequency range, means for mixing a portion of the output of said oscillator with a stabilized wave to produce a first beat frequency wave in the radio fraquency range, an oscillator, means for mechanically varying the tuning of said last-mentioned oscillator over a predetermined frequency range, means for mixing the output of said last-mentioned oscillator with said beat frequency wave to produce a second beat frequency wave in the radio frequency range, means for mixing said second beat frequency wave with a stabilized wave to produce a third beat frequency wave in the radio frequency range, and means for applying a radio frequency wave representative of said third beat frequency wave to said captive oscillator to lock in its frequency with said representative wave.

7. In combination, a captive oscillator whose frequency is to be controlled, said oscillator being mechanically tunable over a predetermined frequency range, a source of harmonic frequency waves, first tunable means coupled to the output of said source for selecting from such output a particular harmonic, unicontrol means for tuning said oscillator and said first tunable means, means for mixing a portion of the output of said oscillator with the output of said first tunable means, second tunable means coupled to the output of said mixing means for selecting from such output a particular first beat frequency wave in the radio frequency range, an oscillator mechanically tunable over a predetermined frequency range, unicontrol means for tuning said second tunable means and said last-mentioned oscillator, means for mixing the output of said last-mentioned oscillator with the output of said second tunable means to produce a second beat frequency wave in the radio frequency range, and means for applying a radio frequency wave representative of said second beat frequency wave to said captive oscillator to lock in its frequency with said representative wave.

8. In combination, a captive oscillator whose frequency is to be controlled, said oscillator being mechanically tunable over a predetermined frequency range, a source of harmonic frequency waves, first tunable means coupled to the output of said source for selecting from such output a particular harmonic, means for mixing a portion of the output of said oscillator with the output of said first tunable means, second tunable means coupled to the output of said mixing means for selecting from such output a particular first beat frequency wave in the radio frequency range, an oscillator mechanically tunable over a predetermined frequency range, means for mixing the output of said last-mentioned oscillator with the output of said second tunable means, third tunable means coupled to the output of said last-named mixing means for selecting from such output a particular second beat frequency wave in the radio frequency range, a unicontrol means for tuning said second and third tunable means and said last-mentioned oscillator, means for heterodyning a wave representative of said second wave to a different frequency, fourth tunable means coupled to the output of said heterodyning means for selecting from such output a particular wave in the radio frequency range, unicontrol means for tuning said captive oscillator and said first and fourth tunable means, and means for applying the particular radio frequency wave selected by said fourth tunable means to said captive oscillator to lock in its frequency with said last-mentioned particular radio frequency wave.

9. In combination, a captive oscillator whose frequency is to be controlled, said oscillator being mechanically tunable over a predetermined frequency range, a source of harmonic frequency waves, first tunable means coupled to the output of said source for selecting from such output a particular harmonic, means for mixing a portion of the output of said oscillator with the output of said first tunable means, second tunable means coupled to the output of said mixing means for selecting from such output a particular first beat frequency wave in the radio frequency range, an oscillator mechanically tunable over a predetermined frequency range, means for mixing the output of said last-mentioned oscillator with the output of said second tunable means, third tunable means coupled to the output of said last-named mixing means for selecting from such output a particular second beat frequency wave in the radio frequency range, unicontrol means for tuning said second and third tunable means and said last-mentioned oscillator, means for mixing said second beat frequency wave with a stabilized wave derived from said source to produce a third beat frequency wave in the radio frequency range, means for applying a radio frequency wave representative of said third beat frequency wave to said captive oscillator to lock in its frequency with said representative wave, and unicontrol means for tuning said captive oscillator and said first tunable means.

10. A frequency generation system comprising a captive oscillator whose frequency is to be controlled, said oscillator having a tank circuit arranged to be mechanically varied in tuning, means for utilizing solely the output of said oscillator as the output of the system, means for mechanically varying the tuning of said oscillator over a predetermined frequency range, means for mixing a portion of the output of said oscillator with solely a stabilized standard frequency wave to produce a first beat frequency wave in the radio frequency range, an oscillator, means for mechanically varying the tuning of said last-mentioned oscillator over a predetermined frequency range, means for mixing the output of said last-mentioned oscillator with said beat frequency wave to produce a second beat frequency wave in the radio frequency range, and means for injecting a radio frequency wave representative of said second beat frequency wave into the tank circuit of said captive oscillator to lock-in its frequency with said representative wave.

References Cited in the file of this patent

UNITED STATES PATENTS

| | | |
|---|---|---|
| 2,379,721 | Koch | July 3, 1945 |
| 2,505,754 | Combs | May 2, 1950 |
| 2,509,963 | Collins | May 30, 1950 |
| 2,521,070 | Lindner et al. | Sept. 5, 1950 |
| 2,534,606 | Kolster | Dec. 19, 1950 |
| 2,582,768 | Colas | Jan. 15, 1952 |
| 2,604,585 | Parker | July 22, 1952 |
| 2,654,832 | Robinson | Oct. 6, 1953 |

FOREIGN PATENTS

| | | |
|---|---|---|
| 494,577 | Great Britain | Oct. 24, 1938 |